United States Patent [19]

Bouma et al.

[11] 4,375,058
[45] Feb. 22, 1983

[54] DEVICE FOR READING A PRINTED CODE AND FOR CONVERTING THIS CODE INTO AN AUDIO SIGNAL

[75] Inventors: Herman Bouma; Dominicus G. Bouwhuis; Paulus M. Boers; Josephus C. Jacobs, all of Eindhoven, Netherlands

[73] Assignee: U.S. Philips Corporation, New York, N.Y.

[21] Appl. No.: 157,133

[22] Filed: Jun. 6, 1980

[30] Foreign Application Priority Data

Jun. 7, 1979 [NL] Netherlands .......................... 7904469

[51] Int. Cl.³ ........................... G06K 7/10; G10L 1/00
[52] U.S. Cl. .............................. 340/146.3 Z; 179/1 SF
[58] Field of Search ............... 340/146.3 SY, 146.3 R, 340/146.3 F, 146.3 K; 179/1 SF, 1 SM; 434/112-117, 308, 309, 312, 313; 235/454, 456, 472, 482; 369/18, 62, 63, 68; 352/26-29

[56] References Cited

U.S. PATENT DOCUMENTS

| | | | |
|---|---|---|---|
| 2,615,992 | 10/1952 | Flory et al. | 179/1 SF |
| 2,771,509 | 11/1956 | Dudley et al. | 179/1 SA |
| 3,114,980 | 12/1963 | Davis | 340/146.3 F |
| 3,474,194 | 10/1969 | Lees et al. | 369/62 |
| 3,752,961 | 8/1973 | Torrey | 340/146.3 K |
| 3,769,468 | 10/1973 | Shutterly | 179/1 SF |
| 3,782,734 | 1/1974 | Krainin | 369/68 |
| 3,803,358 | 4/1974 | Schirf et al. | 179/1 SM |
| 3,812,347 | 5/1974 | Cunningham et al. | 235/472 |
| 3,970,803 | 7/1976 | Kinzie et al. | 434/313 |
| 4,000,565 | 1/1977 | Overby et al. | 179/1 SF |
| 4,044,393 | 8/1977 | Budrose | 434/313 |
| 4,337,375 | 6/1982 | Freeman | 179/1 SF |

*Primary Examiner*—Leo H. Boudreau
*Attorney, Agent, or Firm*—James J. Cannon, Jr.

[57] ABSTRACT

A carrier containing information which is suitable for visual perception, such as a text or a picture. By suitable positioning, a code also present on the carrier linked thereto. This code is visible to the user, but cannot be read directly. A device for reading the code having a scanner which can be moved into the area of the code by hand. The code is optically read, synchronization signals being obtained from the code itself. The information read is stored in an intermediate memory. The intermediate memory is subsequently read under the control of a clock. This data can either directly activate an acoustic generator for producing a sound signal, or can address an object memory which in its turn supplies data for controlling the acoustic generator. A sound signal is thus linked to the picture or the text. A device of this kind may form part of an educational system.

8 Claims, 10 Drawing Figures

DEVICE FOR READING A PRINTED CODE AND FOR CONVERTING THIS CODE INTO AN AUDIO SIGNAL

BACKGROUND OF THE INVENTION

The invention in general relates to a system for reading a printed code in order to convert this code into a signal of a different nature, notably into an audio signal. Systems of this kind are sometimes known as "talking books". The medium may be in a form other than a book (for example, a single sheet of paper). The term "printed" is to be understood to include also other graphic techniques, such as offset and the like. The medium contains information which is suitable for visual reception, for example, in the form of text or pictures. Furthermore, there is provided a code unit (or several code units), for example, a code field which is linked to a part of the "non-code" information by way of its location. Random access to the code is possible to a given extent, for example, in that a sheet of the carrier comprises a plurality of code fields which can be selected by a user "at a glance". The content of the audio signal may be very diverse, such as speech (e.g. in the case of a text printed in a foreign language), music, or background sounds for the display of an occurrence. The invention, however, notably does not relate to sound films with added sound which has to be optically scanned, because sequential scanning is then present for sound as well as pictures; the scanning is then a mechanical scanning which is combined for image and sound, so mutually synchronized in the time. The invention neither concerns systems comprising, for example, a rotating video disc (VLP), which also have a mechanical drive with a synchronization of picture and sound which is fixed in the time, because otherwise separate detectors would be required for sound and picture. Moreover, the video disc does not contain a "visible" picture, but only the code thereof.

The invention, however, notably relates to a device for generating audio signals on the basis of code representations which are derived from a printed carrier and which are present on a visually selectable zone of the surface of the carrier, comprising:

a. first means which are suitable for manipulation and which serve for the selective and optical scanning of said zone and for deriving code signals from the code representations present therein;

b. second means for receiving and processing said code signals and for developing reproduction control signals therefrom;

c. third means for sequential actuation of acoustic generator means under the control of signals originating from said second means.

A device of this kind is known from U.S. Pat. No. 3,474,194. This specification pays attention to the problem which arises when a large bandwidth of the sound is desired, even though the printing quality (in bits per unit of length) be limited. It would also be undesirable if a high (and constant) speed were required during scanning. According to the known technique, the carrier is scanned in a continuous motion by means of a scanner which is moved by hand, reproduction taking place simultaneously with the scanning. Any low frequency is directly stored on the carrier. If a high frequency is to be reproduced, the carrier contains only a signal of low frequency which is assigned to said high frequency. The audio frequency is recovered again (as a sum frequency) by modulation with a higher frequency produced by the system. Thus, a constant and fixed scanning speed is required. Moreover, the described system is very elementary: repeats and similar functions are not possible.

SUMMARY OF THE INVENTION

It is an object of the invention to realize a high sound quality and in general a large information content for the reproduction, without necessitating the storage of a very large amount of information on the carrier and without the necessity of imposing severe requirements as regards the scanning of the code, and to enable at the same time the addition of functions. The objects in accordance with the invention are achieved in that said second means comprise:

b1. an intermediate memory having a data input which is connected to an output of the first means;

b2. a synchronization mechanism for deriving synchronization signals from the signals of the code representations and for controlling the storage of code signals in the intermediate memory by means of these synchronization signals;

b3. a clock for reading code signal information stored in the intermediate memory and for presenting this information to the third means via an output of the second means.

The invention can be used for educational, recreational and other purposes. If desired, the construction of the system may be simple; for example, the acoustic generator means may be embodied in a single loudspeaker. It is advantageous that the synchronization of scanning and reproduction is abandoned, so that less severe requirements may be imposed on the quality of scanning; for example, a faster scan will no longer produce a higher tone. Secondly, the expression possibilities in the signal to be reproduced are substantially increased, because the information read from the intermediate memory need not be a direct representation of the acoustic output signal, but may, for example, address this signal; thus, using particularly little code information, for example, a musical theme or tune can be formed. This sound pattern itself may have a high complexity and/or length. Furthermore, it is also possible to use additional functions such as repeats (possibly with a different volume or a different reproduction speed). The information read may also contain built-in redundancy, so that error detection and/or error correction is possible.

Preferably, said third means comprise an object memory having an address input which is connected to an output of said intermediate memory in order to receive information read therefrom as an address, a data output of said object memory being connected to a control input of said acoustic generator means for the addressing of a sound pattern to be selectively reproduced by the acoustic generator means, per memory location of the object memory. Thus, the reproduction possibilities are further increased, because the storage capacity of the object memory is large with respect to that on the carrier. Thus, longer pieces of text or music can be reproduced. Moreover, the same sound pattern can then be addressed from several code fields. The object memory may be constructed, for example, as a semiconductor memory or as a so-called (magnetic) floppy disc. A further attractive medium in this respect is formed by a video memory disc which can contain a very large quantity of information. As the object memory contains more information per address, the code on the carrier need contain less information for obtaining the same result. On the other hand, a single code field on the carrier can already contain a sequence of address for the object memory, so that the latter requires only a comparatively small capacity per memory location. Furthermore, the object memory can supply several data alternatively for an address received, for example, in accordance with an internal status of the system; for example, in the case of language teaching, the selection from two different voices. At the beginning voice "A" or voice "B" is then chosen.

FURTHER DETAILS OF THE INVENTION

Preferably, the third means comprise synthesizer means which include an input for receiving a control signal derived from said code signals, and an output for activating said generator means. The synthesizer means can receive the information for a given sound, for example, a vowel, consonant, syllable or (arbitrary) word. Synthesizer means of this kind are customary. A simple and inexpensive version is incorporated in the educational toy "Speak 'n Spell", manufactured by Texas Instruments, Dallas, Tex. This instrument has the format of a pocket calculator and comprises a synthesizer for 400 words according to the LPC (linear predictive coding) system. The theory of such a coding system is described in the article "Linear Prediction: A tutorial Review", John Makhoul, Proc. IEEE, 63, No. 4, April 1975, page 561. Separate synthesizer means are offered, for example, by Telesensory Systems in "Electronics", Apr. 12, 1979, page 256. The synthesizer means generally convert the information received into a combination or a time sequence of control signals for the acoustic generator means. Thus, the generator means need not be directly activated, either by the code on the carrier (if no object memory is present) or by a part of the content of the object memory. As a result of this intermediate step, particularly in the case of speech reproduction, less control information is required for external actuation of the acoustic generator means. The code structure on the carrier may thus be simpler or the storage capacity of the object may be comparatively smaller. On the other hand, synthesizer means having a completely different structure can be used for reproduction of music and the like.

Preferably, for the scanning of said zone, having at the most a predetermined dimension, said first means comprise:

a1. a scanning device with an optical display device for displaying said zone on an optically sensitive element, whose dimension is larger than the value corresponding to the image of said predetermined dimension;

a2. a mirror device for visual detection of the correct positioning of said first means by coincidence of an image of said zone and a predetermined sector of said scanning device;

a3. a scan sequence generator for controlling a scanning cycle of said optically sensitive element.

Thus, even a moving scan is no longer required, because a self-scanning arrangement of elementary detector parts may be present. The mirror device simplifies centering of the first means with respect to the code field, because the light originating from the carrier together with the code (for example, reflected light) can be split by way of a (semi) reflective element. Obviously, a prism may also form the reflective element of said mirror device. It is alternatively possible to arrange the code representations in a two-dimensional array: as a result of the larger quantity of information on the carrier, the quantity of information in the object memory may be smaller or even absent. On the other hand, this will necessitate two-dimensional scanning in the optically sensitive element. If such a construction of this element is too expensive, moreover, mechanical scanning will be required in the second direction; however, the severe quality requirements as regards constant scanning speed which are known from the previous art need not be imposed thereon. With a stationary scanning element, the sequence of scanning in the optically sensitive element can usually be co-controlled by the clock which controls the reading of the intermediate memory. The latter memory then performs the function of a first-in-first-out buffer. This enables a simpler operation and/or a reduced capacity in many cases. Thus, the intermediate memory need not accommodate all code information originating together from the carrier. For implementation of the repeat function, the code field is then read once more.

Preferably, for the scanning of code representations on the carrier with a predetermined definition, said optically sensitive element comprises an array of optically sensitive sub-elements having a definition which is finer than said predetermined definition, outputs of the sub-elements being connected to inputs of a data reduction device for combining the information of successive sub-elements within said array and for supplying this combination to said second means as a shortened bit code. This enables the use of a simple printing technique, because the scale of the code representations need no longer be exactly fixed. Even photocopies can now be used as an object for the described reading device. Moreover, the data reduction device can correct given types of errors, for example, an incorrect output signal of an optically sensitive sub-element.

For the reading of code fields with a fixed number of representations in a scanning direction, said data reduction device preferably comprises means for measuring the dimension of the code field in this direction and for forming a linear reduction factor which is proportional to the result of this measurement. This results in a very simple realization for the data reduction and large tolerances in the scale are simply permissible. In the case of tolerances in the enlargement factor, for example, in the case of photocopies, this tolerance will often be the same in two directions. In the case of a two-dimensional array of code representations, the reduction factor has to be determined only once. In the second direction, use can be made of a variable number of code representations (arbitrary number of rows of code bits).

Preferably, said predetermined definition is smaller than the value corresponding to a pair of black/white transitions within 0.2 millimeters. This offers a technique which can be readily carried out and also an efficient use of the space on the carrier. In some applications a coarser definition may be advantageous, for example, for educational aids for young children if the risk of stains on the carrier is high. In many cases the code will then still remain suitably readable.

Said first means are preferably suitable for the instantaneous scanning of a rectangular zone of fixed dimension on the carrier, the long side of the rectangle being situated in the line direction. This is a very attractive solution from an ergonomical point of view. All code fields preferably have the same dimensions. Attractive values for these dimensions are from 2 to 15 mm for the height and from 6 to 30 mm for the width.

BRIEF DESCRIPTION OF THE FIGURES

A preferred embodiment in accordance with the invention will be described in detail hereinafter with reference to the accompanying diagrammatic drawing.

DETAILED DESCRIPTION OF THE PREFERRED EMBODIMENT

Figure 1:
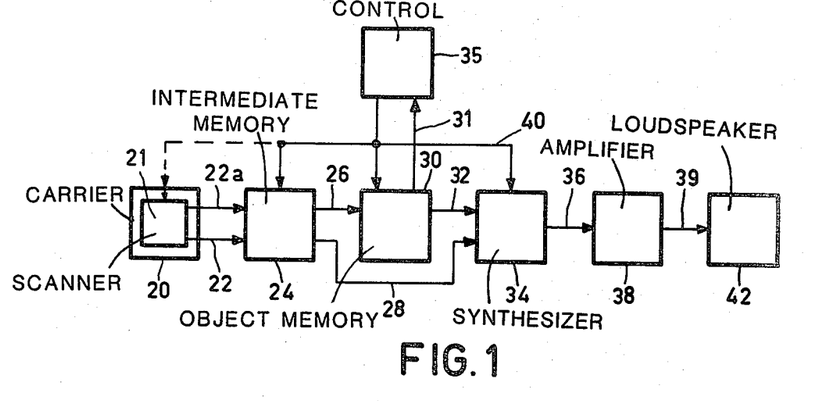
FIG. 1 shows a device in accordance with the invention as a succession of sub-systems.

FIG. 1 shows a device in accordance with the invention in the form of a succession of sub-systems. For the sake of simplicity, the latter are shown as hollow rectangles which will be described in detail hereinafter. Element 35 is the central control element and comprises a clock. The central control element regularly supplies clock signals on a multiple line 40 and, moreover, control signals to the other sub-systems of the device. Block 20 represents the arrangement of carrier with code and the scanner (block 21) which is suitable for manipulation. The code signals derived from the code representations (not shown) appear from the scanner on the possibly multiple connection line 22. Block 24 is in an intermediate memory having a sufficiently large capacity, as will be described hereinafter. Moreover, in block 24 a data reduction is performed. The intermediate memory annex the data reduction device may be independent modules which have been specifically developed for this application. Alternatively, as will be described hereinafter, they may be implemented together in a minicomputer with a clock and adequate storage capacity. In a special purpose module, the intermediate memory will comprise: an address register, a data input gate, a data output gate (the latter two gates possibly combined), a read/write control terminal, and a clock input. The address register comprises a counting input and a reset input. If desired, the memory comprises an input for an overall reset signal. The counting signals, read/write control signals and the overall reset signal are generated by the element 35. The intermediate memory 24 temporarily stores the code signals received on the line 22, after which they can be read, under the control of signals on the line 40, in the sequence corresponding to the sequence of the acoustic reproduction to be controlled at a later stage. In this figure, the intermediate memory 24 comprises output information lines 26, 28 which may be of a multiple type; the latter is the case, for example, when the intermediate memory 24 outputs a multi-bit code in parallel. If the carrier contains comparatively little information, for example, only a single row of code bits, a line 26 to the object memory 30 will be present. The object memory 30 is addressed by signals on the line 26, co-controlled by synchronizing clock signals on the line 40. The address received addresses a first memory location in the object memory. For the reproduction of speech, the object memory receives, for example, the code of a word or a part of word. At the beginning of the reproduction of a word (part), the object memory produces the code of the first sound of this word, for example, the first letter. Under the control of the clock signals, the various sounds (letters) of this word are then successively output in coded form. This is realized in that the address register of the object memory is controlled as a counter. The sequence of addresses is terminated either because a new starting address appears on the line 26 for starting a further series of addresses, or because the address counter of the memory 30 outputs an output carry signal (for example, after a fixed number of addressing operations), or because the last address of each series contains a signal code which terminates the outputting of further codes on the line 32. The object memory 30 generally contains a storage element having a mainly invariable content, such as a ROM or PROM, because the content may remain the same for a large number of read operations. It is suitable for random access. If the reproduction concerns music or something similar, the object memory 30 can contain the codes thereof. The termination of a series of read operations in the object memory 30 is signalled, via the line 31, to the central control element 35 which can subsequently control a further read signal for the intermediate memory 24.

However, if the carrier contains a comparatively large amount of information, the object memory may be omitted. In that case codes appear each time on the line 28 under the control of the clock pulses in order to actuate the synthesizer means 34. The acknowledge signal on line 31, obviously, is then superfluous.

For the reproduction of speech, the element 34 contains the actual synthesizer means. The signals on the lines 28 or 32 address a sound (letter). The synthesizer means comprise a random access storage element (ROM or PROM). The code of a sound activates a first address of the synthesizer means, so that a 32-bit code appears on the line 36. Under the control of the clock signals, every 30 ms a next address is read in the synthesizer means in order to generate a 32-bit signal on the output 36. The number of 32 bits suffices for adequate characterization of an interval of 30 ms speech. It has even been found that, in order to reduce the number of speech bits, a quiet period of 30 ms could be inserted after 30 ms of effective speech, without the subjective quality being substantially affected. Said 32 bits already form the signal of the speech itself, so that no additional processing of the signals by an arithmetic or other process is required. The above methods are very well known from the synthesizer technique, so they will not be elaborated herein. If the reproduction concerns music or similar, the object memory can contain the codes thereof. It follows from the foregoing that 1 second of speech requires approximately 1 kilobit of information or, for a slightly lower quality, only ½k bit. In that case, therefore, each series of 32 bits (serial, parallel or mixed) appears on the line 28 for activation of the further elements of the circuit. If the code on the carrier contains even more information, the synthesizer means may be omitted: a code field for 2 seconds of speech should then contain 2 and 1k bits of information, respectively.

The information on the line 36 activates the amplifier 38 (conventional audio amplifier). The signal thereof on the line 39 actuates the loudspeaker (loudspeakers) 42.

Figure 2:
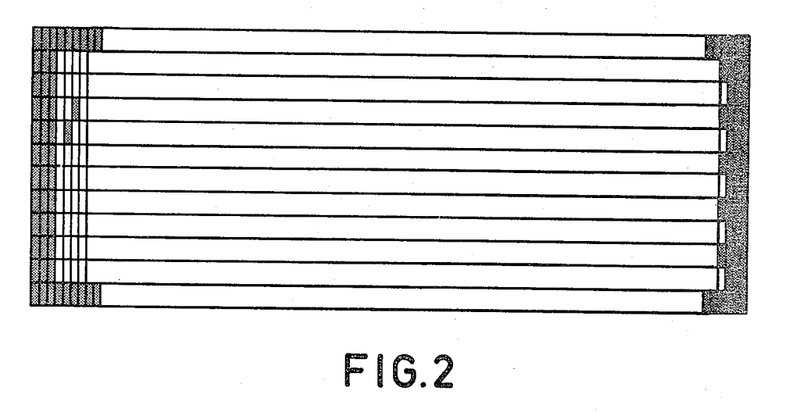
FIG. 2 shows an example of a code to be read.

FIG. 2 shows an example of a code field to be read. It consists of a two-dimensional pattern of bit fields which may be bivalent black or white. The long side of the code field extends from left to right for the user. The dimensions of a bit field are: height 500 microns, width 160 microns. The code field consists of 12 rows of 106 bits, so it has a width of 16.96 mm and a height of 6 mm. The upper row of code fields is completely black, and so is the lower row. A fixed number of starting bits and a fixed number of end bits (for example 3) of the other rows is always black in order to form a start code and a stop code, respectively. Thus, the entire information-carrying code (1000 bits) is surrounded by a dark frame which forms a two-dimensional start/stop code. In this example there are 1000 information bits. Scanning must be performed each time over a single line of bit fields. It follows that the maximum permissible angle of rotation between the optimum and the actual position of the code field is given as the ratio of the height of a bit field and the width of the entire code field, approximately arc tan 1/34. It has been found that this can be very well realized in practical applications. In the above example, self-synchronizing code properties are obtained in that the code field has a predetermined length. Each bit field can indicate "0" and "1" without restriction. As will be explained at a later stage, an optically sensitive element with synchronous auto-scanning (in the line direction) will then generally be required. This synchronous auto-scanning can also be performed in a two-dimensional manner. A known arrangement in this respect is formed by the module Matrix Array RA $100 \times 100 - 1$ (or $-2$), Reticon, 910 Benicia Ave, Sunnyvale Calif. This module, however is comparatively expensive. If such an element cannot be chosen from this point of view (electro)mechanical scanning must be realized in one of the two directions. This can be realized in various manners: an automatic method utilizes, for example, a hinging mirror which, during a hinging movement, images each time a next strip of a code field on an optically sensitive element which operates with auto-scanning in one dimension. A hinging mirror of this kind is described, for example, in U.S. Pat. No. 4,057,784, FIG. 1. It is alternatively possible to scan the code field by means of a scanner which is manually operated by a user during scanning, for example, from the top downwards in the Figure. For this purpose, an adaptation is shown at the right of FIG. 2; the last information bit of all odd code rows is black, and the last information bit of all even code rows is white. A set-up of this kind can also be chosen for the first information bit, but this is not shown. The detection of a black/white transition for the extreme information bit on both sides (see hereinafter) indicates that the adjustment to a next row of code bits is "correct". Moreover, the correct alignment of the scanner (not inclined) is thus tested. The upper row of black bits can be used for correcting an inclined scanner position. It is assumed that each row of code bits is interrogated a few times by successive scans of the scanner (comparable to the scanning lines of a television picture). A correct code bit will then be found, for example, by the comparison of two or three successive scanning lines, as will be explained hereinafter with reference to a decision concerning the scanning bits which is to be taken within a single row. If this row is found to contain a white bit, for example, in the bit position 50 and also in at least one position higher than 50, so more to the right, the right side of the code field is positioned too high. For the bit positions, between for example 40 (slightly smaller than 50) and 106, addressing must be performed one row higher than for the bits 1-39 in order to find the correct row of code bits. This implies an addressing operation for the intermediate memory which can be readily performed. A corresponding operation can be performed when on two or more rows the transition is found between the black upper bar and the part of the code field containing information. For example, for line j the first white bit is 70, for line j+1 the first white bit is 42: these two bits then indicate the limits beyond which two and one rows of scanning bits, respectively, higher must be addressed. It is alternatively possible to use only the two extreme bits of the upper row and to use the difference between the first line number containing a black bit for left and right as a measure for the inclination. The lay-out of the code field shown thus offers adequate space for the direct storage of 1-2 seconds of speech, without addressing of additional, permanently stored information being necessary.

Figure 3:
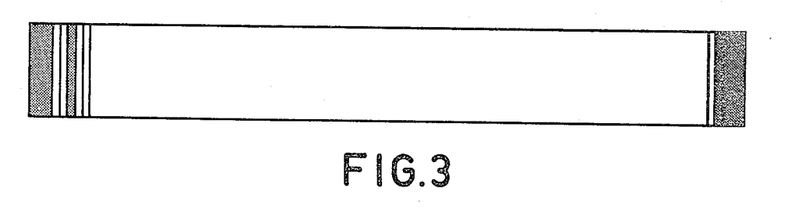
FIG. 3 shows a further example of a code to be read.

It is also possible to choose a one-dimensional code. In the above case, one line of $100 \times 1$ bits would then be available; this is in may cases sufficient for the addressing of a wide variety of sound patterns, because $2^{100}$ different patterns are addressable. Even if this information is divided and each part forms an address, many different sound patterns can still be addressed. In the code field, moreover, the upper and lower rows of black bits can then be dispensed with, while the height of the bit fields will often be chosen to be larger, for example, 2 mm (instead of 0.5 mm line in FIG. 2). Synchronization can be realized on the one hand in the same manner as for a row of data bits. On the other hand, manual scanning can also be used in the line direction. In that case synchronization is realized in that sufficiently many black-white transitions occur. Appropriate codes in this respect are generally known from serial data transmission. An example of a code field is given in FIG. 3. The width corresponds to that in FIG. 2.

Figure 4:
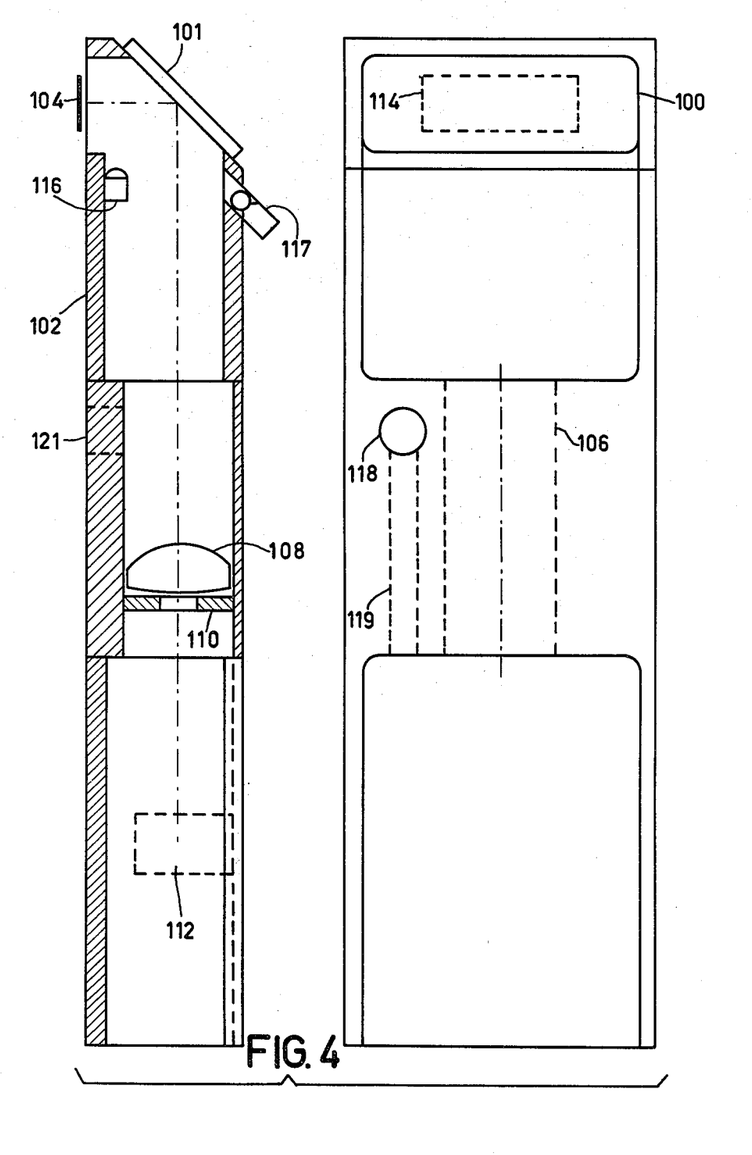
FIG. 4 shows an appropriate scanner.

FIG. 4 is a plan view and a sectional view at a scale of approximately 2:1 of a scanner which is suitable for manual positioning. In this embodiment, the external dimensions are $108 \times 34 \times 17$ mm. In the operating position, the surface 102 is situated on the record carrier (book or sheet), the code being notably situated (during reading) at the area of 104 which is denoted as a black bar. The optical axis of the image is shown as a stroke/-dot line. At the area 100, there is provided a bevelled aperture on which a mirror 101 having a slightly larger dimension is attached. This mirror is suitably reflective at a wavelength of 900 nm (near infrared) and partly transmissive (approximately 20%) in the visible range. The light originating from the area of the code field passes, after reflection by the mirror, through the round channel 106 and is focussed by the lens 108. This is an achromatic lens having two components (not separately shown) and a focal distance of 200 mm. The positioning of the lens is such that the linear magnification (in this case reduction) is approximately 0.6. If desired, the lens may comprise a known focusing device: if the contrast on the optically sensitive element is insufficient, the lens should then be slightly shifted. Element 110 is an aperture having a diameter of 3 mm. The light is focused on a scanning element 112 of the type IPL 152 M, make Integrated Photomatrix Ltd, Grove Trading Estate, Dorset, GB. In the line direction, this scanning element has a dimension of 12.7 mm ($\frac{1}{2}$ inch) and comprises 512 photodiodes and also two shift registers, one for the even diodes and one for the odd diodes, with associated, separate outputs. The row of photodiodes is arranged parallel to the plane of the carrier (plane 102). A biconcave lens is arranged just before the scanning element in order to reduce image curvature. From 20 to 30 mm is an attractive value for the focal distance in this case. A better solution could be obtained by means of a plano-concave lens, but it is difficult to realize such a lens for such a small focal distance. The mechanical connection of the components of the scanner is realized in a conventional manner (screwing, glueing, hardsoldering) and will not be described for the sake of brevity. As a result of its limited dimensions and weight, the scanner can be readily handled and positioned by hand.

The light to be selectively reflected by the code field is produced by an array 116 (row) of five GaAs LEDs (solid-state light sources) having an emission peak in the (infra) red part of the spectrum. These diodes are connected to the bottom plate of the detector in a conventional manner. The light of the light sources is emitted towards the side of the code field where it is diffusely reflected. Some light may be transmitted from the outside to the inside by the mirror, so that it reaches the carrier at the area of the code field. This acts as an additional illumination and the contrast between "dark" and "light" on the scanning element 112 is not influenced thereby. On the other hand, the channel 106 is sufficiently narrow to ensure that only little external light can be directly incident on the scanning element. A subsidiary solution for the illumination of the code field is formed by a row of miniature incandescent lamps (for example, five lamps) as shown at 117. The outer lamps of this row operate with a slightly larger current in order to realize uniform illumination of the code field. If the carrier is sufficiently transparent to light, the light source can also be arranged on the lower side of the carrier. The electrical connections for the LED or other light sources and the scanning element have been omitted for the sake of simplicity. Because a part of the light is transmitted by the semitransparent mirror 101, the user can center the detector on a code field, and the scanning can be performed simultaneously. The positioning of this code field is indicated in the plan view of FIG. 4 as a rectangle having sides of 6 and 17 mm. Because the code field and the window both have a rectangular shape, it is easy to obtain a setting where the long sides are sufficiently parallel. Finally, the reference numeral 118 denotes a location for a starting button which is to be manually operated and which is vertically arranged in the bore 121. A line can be connected via the channel 119. In given cases it is advantageous to replace part of the lines, or all lines, to the remainder of the device (elements 24, 35 in FIG. 1) by a wireless connection.

Figure 5:
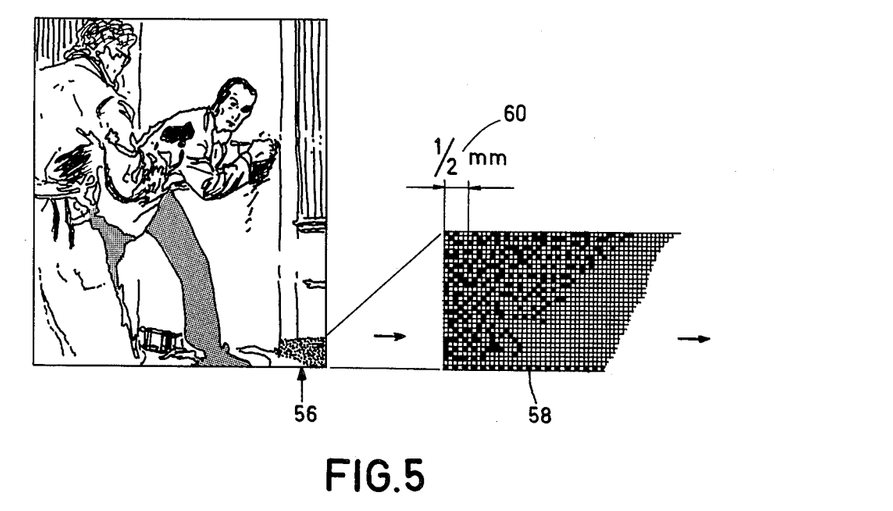
FIG. 5 shows an example of the use of a code field.

FIG. 5 shows an example of the use of such a code. The lower right corner of a picture is provided with a code field (at 56). 58 shows an enlargement to illustrate the shape of the code. It differs from that in FIG. 2, but is mainly shaped again as a rectangle. The lower row of bit fields represents a clock track (a sequence 0-1-0-1-0 ...). The information of the code may comprise (in this case): speech, background noises, such as the blast of the pistol, and inarticulate sound, for example, groaning. The scale of the code is given at 60.

The physical realization of the scanner has been described above. The optically sensitive element is a standard OEM module. Its manufacturer also supplies adaptation electronics and associated documentation specifically developed for this module which, therefore, will not be elaborated herein. Notably under the control of a clock pulse series of suitable frequency, the row of photodiodes can be continuously scanned, a scanning start pulse being generated each time at the beginning of a new scanning sequence of 512 diodes. This pulse appears on line 22a in FIG. 1; this completes the description of the scanner. In this case the scanner need not receive control signals. The signal on the line 22a can then initiate the storage in the intermediate memory. This will be elaborated at a later stage.

A microprocessor/microcomputer can be advantageously used for the control unit 34. The intermediate memory 24 and the object memory, if present, can be formed by the internal memory of such a module, or by an add-on memory having the necessary capacity. In the embodiment to be described hereinafter, the elements 24, 30 and 34 are realized together in a minicomputer P 857 M, make Philips Data Systems B.V. This computer is described in the manual P 856 M/P 857 M System Handbook, ISBN indication 5122.991.26932, published in Apeldoorn, the Netherlands, April 1976. The storage capacity of the version used amounted to 32k bytes. Only a small part thereof was needed for realizing the intermediate memory in view of the limited amount of information on the carrier. The remainder of the said 32k bytes is available for program signals and as an object memory. Such a minicomputer offers an extremely accessible and diverse set-up for the design of the control. In series production, the use of a microcomputer will be preferred. Its operation will be described with reference to a number of flowcharts. These charts relate to a code field consisting of a single row of code bits.

Figure 6A:
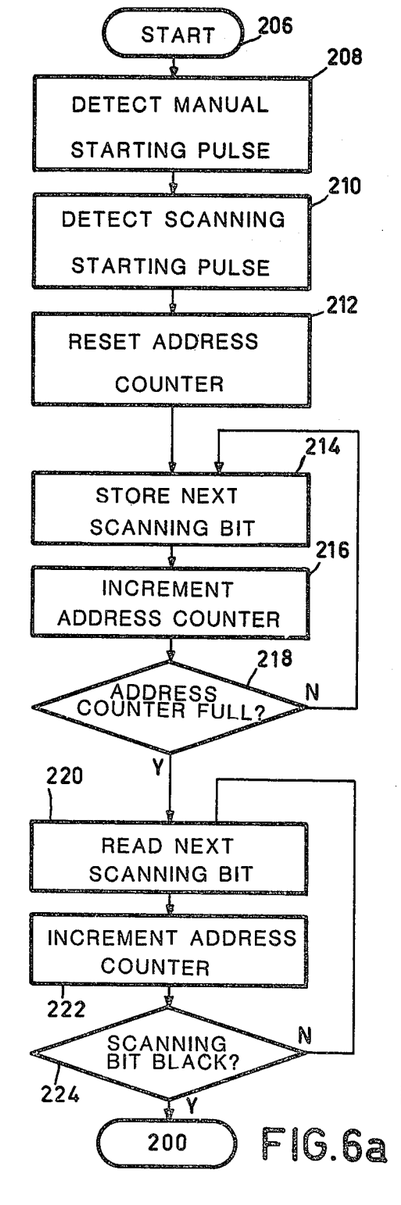
FIGS. 6a, 6b, 6c show a flowchart for the data reduction.
Figure 6B:
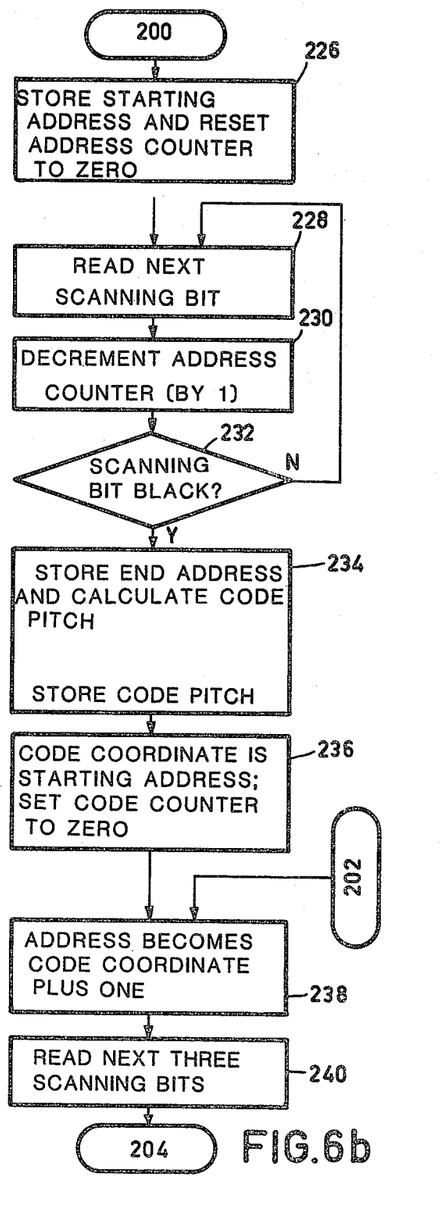
Figure 6C:
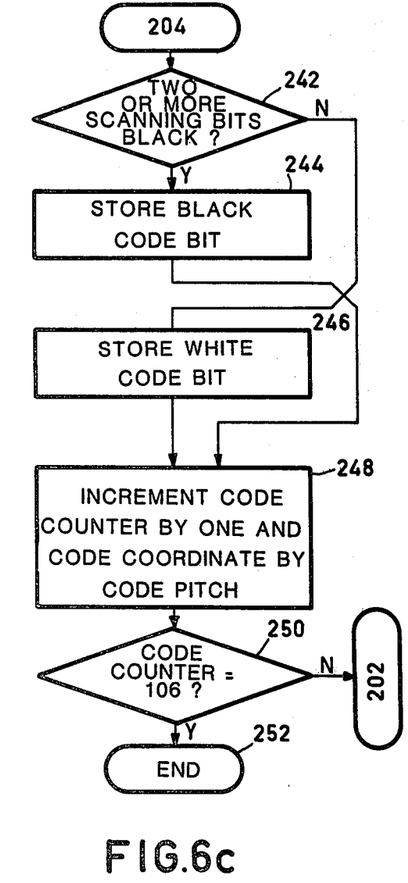
Figure 6D:
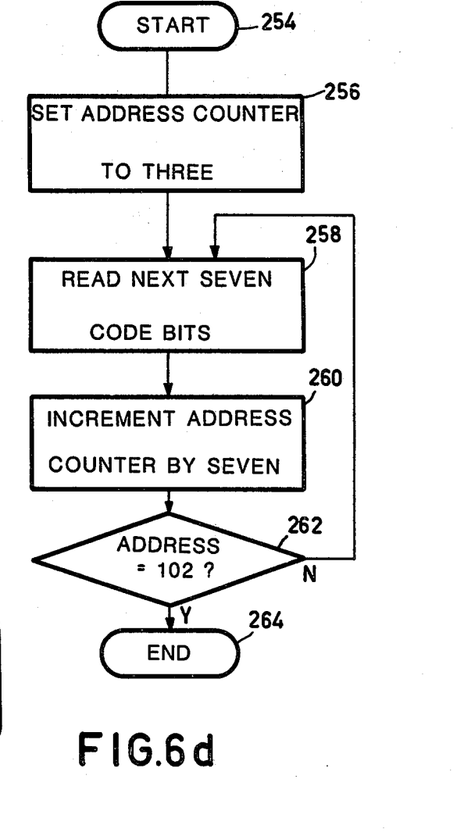
FIG. 6d shows a further flowchart.

The FIGS. 6a, 6b, 6c show a flowchart for extracting a series of signals from the carrier, for storing the signals in the intermediate memory, and for realizing a data reduction in order to recover the data bits from the carrier. These data bits are referred to hereinafter as code bits for the purpose of distinction from the scanning bits produced by the scanning element itself and the subsequent decision element, a conventional Schmitt trigger. The decision element converts the value of the scanning quantities into a bivalent quantity black/white. Block 206 is reached when the start conditions for the apparatus are present, such as an appropriate supply voltage and the like. Block 208 is reached under the control of the activation switch 118 on the scanner. If necessary, this switch is followed by known means for protection against contact jitter. Block 210 is reached under the control of the cyclically repeated starting pulse which is generated by the optically sensitive element at the beginning of each scanning sequence of the 512 sensitive elements. In block 212, the address counter is set to zero for the temporary storage of the scanning bits. In block 214, the first scanning bit is stored at the address then prevailing. In block 216, the address for this storage is incremented by one unit. In block 218 it is tested whether this address counter has reached a predetermined upper limit in order to signal that all 512 scanning bits have been loaded. It is assumed that this address counter automatically returns to the position "zero" when it reaches its maximum position. If not, it must be separately reset to zero between the blocks 218 and 220. In block 220, the first scanning bit is read. In block 222, the address counter is incremented by "1"; this is continued until the first black scanning bit is detected in block 224. The address of this bit then becomes the starting address (block 226). Similarly, the blocks 228, 230, 232 form a loop for detecting the last black scanning bit: the address of this bit becomes the end address. The difference between the starting address and the end address is the physical length of the code field. This corresponds to 106 code bits. The subsequent data reduction is based on the fact that all code fields have the same number of code bits. From the length of the code field on the carrier (16.96 mm), the lens reduction (0.6), the dimension of the optically sensitive element in the line direction (12.7 mm), and the number of scanning diodes (512), it follows that each code bit on the carrier corresponds substantially exactly to three diodes on the optically sensitive element. This value "3" is the code pitch, which may also have other values, for example, between 2.5 and 4 (block 234). The code coordinate becomes the beginning of the next code bit (blocks 236, 238) after rounding off to an integer value. In the blocks 240, 242, 244, 246, a majority decision black/white is executed on the basis of the three relevant scanning bits and the information is stored as a code bit. In block 240, a transition takes place to FIG. 6b. As a result of said majority decision, a first level of error correction is introduced. An incorrect scanning bit may be caused by an incidental disturbance. On the other hand, an incorrect scanning bit may also be due to the fact that the three scanning bits considered are not aligned with the bit field present on the carrier. As a result of the algorithm followed in the block 238, the first two scanning bits considered are certainly properly aligned if nominally three scanning bits correspond to one bit field on the carrier. If this factor is smaller, for example, 2½, the first scanning bit is completely aligned and the second scanning bit for at least 50%. In that case, however, it is better to use a rounding off operation instead of the "entire" operation. If said factor is at least 2½, two scanning bits will always be completely aligned with the bit field on the carrier. If said factor is larger than three, given scanning bits will not be used for a code bit, but this is not objectionable. In block 248, the code coordinate is adjusted for the next code bit until (block 250) the code counter has reached its maximum position. The code bits are stored at the address indicated by the code counter. Thus, the scanning bits are written over, but they have already been processed anyway. When 106 bits have been stored, the information of these scanning bits has been processed. Subsequently, a number of tests can be performed, for example, testing of starting bits and stop bits and further tests, for example, parity tests and possibly error corrections if the code bits are formulated in an error-correcting code. Codes of this kind are known per se and will not be elaborated herein. Thus, the result is 106 information bits. The flowchart of FIG. 6d illustrates the use of these 106 information bits. The addresses 0-3 contain starting bits. The addresses 4-101 contain information which is organized as 14 series of 7 bits each. Each series of seven bits contains the ASCII code of a character, a punctuation mark or the like. Thus, block 254 is reached directly after block 252, or possibly after a secondary starting signal. Block 256 produces the starting address. The cycle of blocks 258, 260, 262 each time produces such an ASCII code. After fourteen of such characters, block 264 is reached. The acoustic reproduction is completed in parallel.

The foregoing demonstrates that the synchronization mechanism during writing in this embodiment is based on the fact that the code field on the carrier always contains a fixed number of information bit fields on a line; the period is determined from the width of the code field. This method is also effective when the code field obtains a different dimension due to the printing technique or other causes. Within the processing devices the electronic synchronization for the reproduction is obtained from a suitable oscillation; in the present embodiment, this is the clock of the minicomputer used.

Hereinafter, the verbal contents of the blocks of FIGS. 6a, 6b, 6c are given: 206: start; 208: detect manual starting pulse; 210: detect scanning starting pulse; 212: reset address counter; 214: store next scanning bit; 216: increment address counter; 218: address counter full?; 220: read next scanning bit; 222: increment address counter; 224: scanning bit black?; 226: store starting address and reset address counter to zero; 228: read next scanning bit; 230: decrement address counter (by 1); 223: scanning bit black?; 234: store end address and calculate code pitch as end address minus starting address÷106; store code pitch; 236: code coordinate becomes starting address; code counter to zero; 238: address becomes entire (of code coordinate) plus one; 240: read next three scanning bits; 242: two or more scanning bits black?; 244: store black code bit; 246: store white code bit; 248: increment code counter by one and code coordinate by code pitch; 250: code counter=106?; 252: end. FIG. 6d contains the following blocks: 254: start; 256: set address counter to three (note: the addresses 0, 1, 2, 3 contain the starting bits); 258: read next seven code bits; 260: increment address counter by seven; 262: address≧102?; 264: end; the addresses 102, 103, 104, 105 in this case contain four stop bits.

Figure 7:
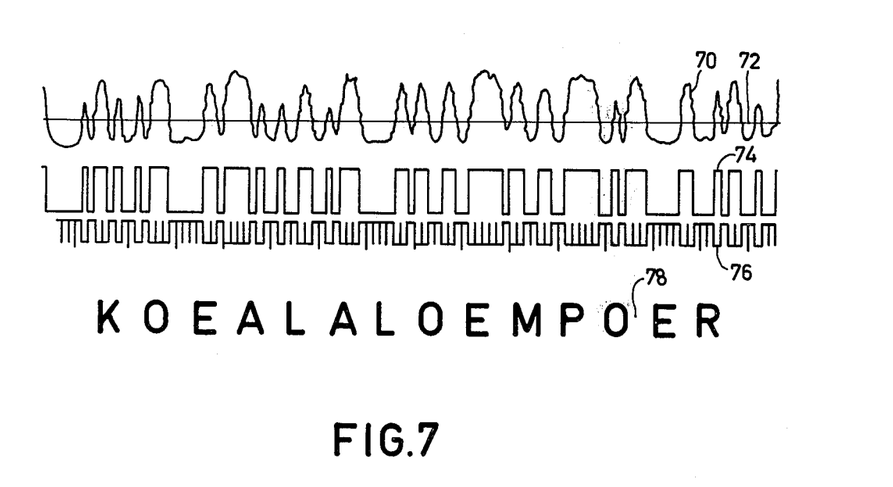
FIG. 7 shows signals read.

FIG. 7 shows a number of signal curves, notably with reference to the example of the FIGS. 6a-d. Curve 70 is the electric signal of the 512 photodiodes read, so not yet the binary signal corresponding to block 214 in FIG. 6a. Curve 72 denotes the decision level between "black" and "white" which is fixed in this case. Curve 74 is a digitized signal of the 512 codes. Curve 76 is the series of code bits, so it corresponds to the result of the block 248 in FIG. 6b. Separations between code bits are indicated by a vertical line, separations between the 7-bit characters and separations between the start/stop bit groups and the adjoining 7-bit characters being denoted by a longer vertical line. The read sequence is such that the reproduction starts at the right. The starting bits thus have the value "1101", the stop bits having the value "1111" and the character "e", occurring three times, having the code "1000101" (high is 1). In this case line 76 contains 106 code bits. The end of the signal of line 74 contains two additional black bit signals which are suppressed by an additional operation. Line 78 shows the identities of the 14 characters read (in the reverse order with respect to line 26). Together with the visual reproduction of these characters, for example, on a television monitor, the synthesizer means are activated to reproduce a letter sound. If desired, the latter means can provide a start signal for changing over from block 262 to block 258 in FIG. 6d.

What is claimed is:
1. A device for generating audio signals on the basis of printed code representations that are present on a visually selectable zone of the surface of a carrier, said device comprising:
   (a) first means, suitable for manipulation, for the selective and optical scanning of said zone and for deriving code signals from the code representations present in said zone;
   (b) second means, including an intermediate memory having a data input which is connected to an output of the first means, for receiving and processing said code signals and for developing reproduction control signals therefrom;

(c) within said second means a synchronization mechanism for deriving synchronization signals from the signals of the code representations and for controlling the storage of code signals in the intermediate memory by means of these synchronization signals;

(d) clock means within said second means for controlling the reading of code signal information stored in the intermediate memory and for presenting these code signals on an output of the second means, (e) third means having an input connected to an output of the second means for receiving therefrom control signals, for the sequential actuation of acoustic generator means included in said third means.

2. A device as claimed in claim 1, characterized in that said third means comprise an object memory having an address input which is connected to an output of said intermediate memory in order to receive information read therefrom as an address, a data output of said object memory being connected to a control input of said acoustic generator means for the addressing of a sound pattern to be selectively reproduced by the acoustic generator means for each memory location of the object memory.

3. A device as claimed in claim 1, characterized in that the third means comprise synthesizer means which include an input for receiving a control signal derived from said code signals, and an output for activating said generator means.

4. A device as claimed in claim 1, characterized in that for the scanning of a said zone, having at the most a predetermined dimension, said first means comprise:

a1. a scanning device with an optical imaging device for imaging said zone on an optically sensitive element whose dimension is larger than the value corresponding to the image of said predetermined dimension;

a2. a mirror device for visual detection of the correct positioning of said first means by coincidence of an image of said zone and a predetermined sector of said scanning device;

a3. a scan sequence generator for controlling a scanning cycle of said optically sensitive element.

5. A device as claimed in claim 4, characterized in that for the scanning of code representations on the carrier with a predetermined definition, said optically sensitive element comprises an array of optically sensitive sub-elements having a definition which is finer than said predetermined definition, outputs of the sub-elements being connected to inputs of a data reduction device for combining the information of successive sub-elements within said array and for supplying this combination to said second means as a shortened bit code.

6. A device as claimed in claim 5, characterized in that for the reading of code fields with a fixed number of representations in a scanning direction, said data reduction device comprises means for measuring the dimension of the code field in this direction and for forming a linear reduction factor which is proportional to the result of this measurement.

7. A device as claimed in claim 5, characterized in that said predetermined definition is smaller than the value corresponding to a pair of black/white transitions within 0.2 mm.

8. A device as claimed in claim 4, characterized in that said first means are suitable for the instantaneous scanning of a rectangular zone of fixed dimension on the carrier, the long side of the rectangle extending in the line direction.

* * * * *